US 8,168,984 B2

(12) United States Patent
Lin et al.

(10) Patent No.: US 8,168,984 B2
(45) Date of Patent: May 1, 2012

(54) LIGHT EMITTING DIODES WITH SMOOTH SURFACE FOR REFLECTIVE ELECTRODE

(75) Inventors: Chao-Kun Lin, Livermore, CA (US); Heng Liu, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 13/033,533

(22) Filed: Feb. 23, 2011

(65) Prior Publication Data

US 2011/0140125 A1    Jun. 16, 2011

Related U.S. Application Data

(62) Division of application No. 12/834,747, filed on Jul. 12, 2010, which is a division of application No. 12/120,051, filed on May 13, 2008, now Pat. No. 7,781,780.

(60) Provisional application No. 61/041,172, filed on Mar. 31, 2008.

(51) Int. Cl.
    *H01L 31/0256* (2006.01)

(52) U.S. Cl. ........... 257/76; 257/194; 257/E33.034; 438/26; 438/46

(58) Field of Classification Search .................. None
See application file for complete search history.

(56) References Cited

U.S. PATENT DOCUMENTS

| 4,680,602 | A  | 7/1987  | Watanabe et al.   |
|-----------|----|---------|-------------------|
| 6,515,417 | B1 | 2/2003  | Duggal et al.     |
| 6,545,296 | B1 | 4/2003  | Mukaihara et al.  |
| 6,639,354 | B1 | 10/2003 | Kojima et al.     |
| 6,949,395 | B2 | 9/2005  | Yoo               |
| 7,148,149 | B2 | 12/2006 | Ohno et al.       |
| 7,151,881 | B2 | 12/2006 | West et al.       |
| 7,485,897 | B2 | 2/2009  | Seong et al.      |
| 7,537,949 | B2 | 5/2009  | Letertre et al.   |
| 7,598,105 | B2 | 10/2009 | Lee et al.        |
| 7,626,327 | B2 | 12/2009 | Shimada et al.    |
| 2002/0105986 | A1 | 8/2002 | Yamasaki         |
| 2004/0245543 | A1 | 12/2004 | Yoo             |
| 2005/0173715 | A1 | 8/2005 | Kyono et al.    |
| 2005/0184305 | A1 | 8/2005 | Ueda            |
| 2005/0189551 | A1 | 9/2005 | Peng et al.     |
| 2006/0006404 | A1 | 1/2006 | Ibbetson et al. |
| 2006/0255341 | A1 | 11/2006 | Pinnington et al. |
| 2007/0096121 | A1 | 5/2007 | Ni et al.       |
| 2007/0221907 | A1 | 9/2007 | Jang et al.     |
| 2007/0272939 | A1 | 11/2007 | Peng            |
| 2008/0265258 | A1 | 10/2008 | Tanabe et al.  |
| 2008/0315228 | A1 | 12/2008 | Krames et al.  |
| 2009/0127575 | A1 | 5/2009 | Horng et al.   |
| 2009/0152584 | A1 | 6/2009 | Grillot et al. |

FOREIGN PATENT DOCUMENTS

EP    1 746 641 A1    1/2007

*Primary Examiner* — Zandra Smith
*Assistant Examiner* — Khanh Duong
(74) *Attorney, Agent, or Firm* — Michael S. Garrabrants; ArtesynIP

(57) ABSTRACT

A light emitting diode comprising an epitaxial layer structure, a first electrode, and a second electrode. The first and second electrodes are disposed on one side of the epitaxial layer structure. The epitaxial layer structure includes a transparent ohmic contact layer having a root-means-square (RMS) roughness less than about 3 nm at a surface whereon the second electrode is formed. The epitaxial layer structure includes a p-type epitaxial layer and a n-type epitaxial layer, wherein the n-type epitaxial layer is coupled between the first electrode and the p-type epitaxial layer, and the p-type epitaxial layer is between the second electrode and the n-type epitaxial layer. The first electrode is located on the n-type epitaxial layer.

14 Claims, 4 Drawing Sheets

LIGHT EMITTING DIODES WITH SMOOTH SURFACE FOR REFLECTIVE ELECTRODE

CROSS-REFERENCE TO RELATED APPLICATION

This is a Divisional Application which claims the benefit of pending U.S. patent application Ser. No. 12/834,747, filed Jul. 12, 2010, which claims priority to U.S. patent Ser. No. 12/120,051, filed on May 13, 2008, now U.S. Pat. No. 7,781, 780, which claims priority to Provisional Application No. 61/041,172, filed Mar. 31, 2008.

BACKGROUND

1. Field

The present disclosure relates to a light emitting diode (LED) structure, and more particularly to a LED structure with a smooth surface for a reflective electrode.

2. Background

Light emitting diodes (LEDs) have been developed for many years and have been widely used in various light applications. As LEDs are light-weight, consume less energy, and have a good electrical power to light conversion efficiency, in some application areas, there have been intentions to replace conventional light sources, such as incandescent lamps and fluorescent light sources, with LEDs. Such LEDs produce light in a relatively narrow angular spread direction without side light so that the light cannot be easily collected by optical elements in a package. In other words, thin-film AlInGaN LEDs produce more light per steradian and photons generated therefrom can be efficiently utilized compared to the conventional lateral LEDs with sapphire substrate attached. However, the efficiency (Lumen/W) of the current LEDs is still not high enough to replace the conventional light source for general illumination or other light applications.

Therefore, there is a need in the art to improve the structure of the LEDs so that they emit light in more efficient ways than conventional LEDs.

SUMMARY

In an aspect of the disclosure, a light emitting diode includes an epitaxial layer structure, a first electrode, and a second electrode. The first and second electrodes are disposed on one side of the epitaxial layer structure. The epitaxial layer structure comprises a transparent ohmic contact layer having a root-means-square (RMS) roughness less than about 3 nm at a surface whereon the second electrode is formed. The epitaxial layer structure includes a p-type epitaxial layer and a n-type epitaxial layer, wherein the n-type epitaxial layer is coupled between the first electrode and the p-type epitaxial layer, and the p-type epitaxial layer is between the second electrode and the n-type epitaxial layer. The first electrode is located on the n-type epitaxial layer.

It is understood that other aspects of the present invention will become readily apparent to those skilled in the art from the following detailed description, wherein it is shown and described only exemplary aspects of the invention by way of illustration. As will be realized, the invention includes other and different aspects and its several details are capable of modification in various other respects, all without departing from the spirit and scope of the present invention. Accordingly, the drawings and detailed description are to be regarded as illustrative in nature and not as restrictive.

BRIEF DESCRIPTION OF THE FIGURES

Various aspects of the present invention are illustrated by way of example, and not by way of limitation, in the accompanying drawings, wherein.

DETAILED DESCRIPTION

The detailed description set forth below in connection with the appended drawings is intended as a description of various aspects of the present invention and is not intended to represent all aspects in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

Figure 1A:
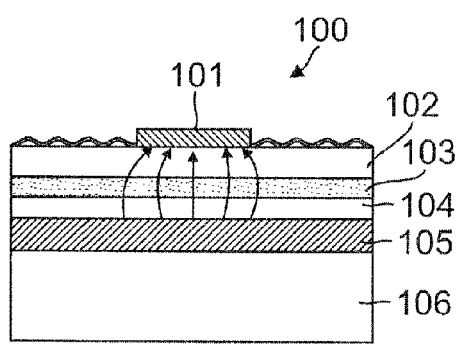
FIG. 1A is a cross sectional view of a vertical LED structure.
Figure 1B:
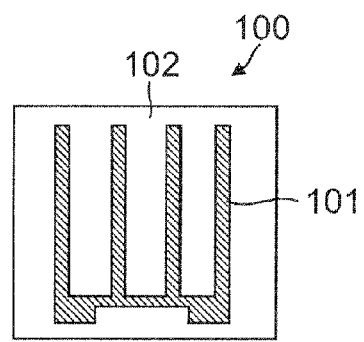
FIG. 1B is a top view of a vertical LED structure, in which a patterned n contact is shown.

FIGS. 1A and 1B illustrate a cross-sectional view and a top view of a vertical LED device, respectively. The vertical LED device 100, as shown in FIG. 1A, has a vertical current injection configuration, including a patterned n-type contact (or n-type electrode) 101, an n-type GaN-based layer 102 with a roughened surface, an active region 103, a p-type GaN-based layer 104, a broad area reflective p-type contact (or p-type electrode or reflective p electrode) 105, and a thermally and/or electrically conductive substrate 106 to support the device structure mechanically.

In the manufacturing process, the n-type GaN-based layer 102 is formed on a substrate (not shown), the active region 103 is formed on the n-type GaN-based layer 102, and the p-type GaN-based layer 104 is formed on the active region 103, however, other layers may be included. The p-type electrode 105 is directly or indirectly formed on p-type GaN-based layer 104. The substrate on which the n-type GaN-based layer 102 is formed is removed so that the patterned n-type electrode 101 can be formed on the surface of the n-type GaN-based layer 102 that was attached to the removed substrate. The reflective p-type electrode 105 is mounted on the thermally conductive substrate 106 for mechanical support.

As the n-type GaN-based layer 102 and the p-type GaN-based layer 104 are opposite to each other, together they form a pair of carrier injectors relative to the active region 103. Therefore, when a power supply is provided to the LED device 100, electrons and holes will be combined in the active region 103, thereby releasing energy in the form of light. In FIG. 1A, arrows inside the LED device 100 show that an electrical path is generally vertically formed from the p-type electrode 105 to the patterned n-type electrode 101. FIG. 1B shows a top view of the vertical LED of FIG. 1A, in which an n-type contact with four fingers and a crossbar is shown. It will be recognized by those of ordinary skill in the art that the electrode pattern of the n-type contacts is not limited to the electrode pattern as illustrated.

Figure 2A:
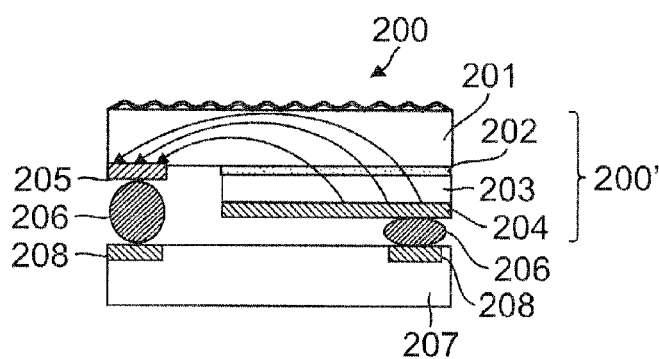
FIG. 2A is a cross sectional view of a flip-chipped lateral LED structure with metal joints and a sub-mount.

FIG. 2A illustrates a cross-sectional view of a flip-chipped lateral LED device 200. As shown, the flip-chipped lateral LED device 200 is formed as a lateral LED device 200' having a lateral current injection configuration that is flipped over and mounted on a sub-mount substrate 207 with matching metal contact pads 208. The sub-mount substrate 207 may be electrically insulated or electrically conductive. The metal contact pads 208 are electrically isolated from each other either by forming an electrically insulating sub-mount 207 or an insulating dielectric coating formed over an electrically conducting sub-mount (not shown). The lateral LED device 200' includes an n-type GaN-based layer 201 with a roughened surface, an active region 202 formed on the n-type GaN-based layer 201, a p-type GaN-based layer 203, a p-type electrode 204, and an n-type electrode 205.

In the manufacturing process, before forming the n-type electrode, parts of the p-type electrode 204, the active region 202, and the p-type GaN-based layer 203 are removed to allow the n-type electrode 205 to be formed on top of the n-type GaN-based layer 201. In FIG. 2A, the arrows inside the LED device 200' show that an electrical path is formed from the p-type electrode 204 to the n-type electrode 205. After the n-type electrode 205 is formed, the LED device 200' is flipped over to mount on the sub-mount substrate 207 via solders or metal interconnects 206 to form the flip-chipped lateral LED device 200.

Figure 2B:
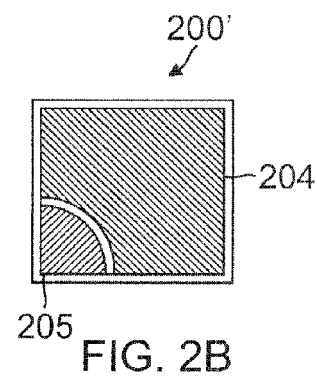
FIG. 2B is a top view of a flip-chipped lateral LED structure with both p and n electrodes before flip-chipped to a sub-mount.

FIG. 2B shows a top view of the LED device 200' of FIG. 2A before being flipped over to mount on the sub-mount substrate 207. FIG. 2B shows that the p-type electrode 204 has an area larger than that of the n-type electrode 205.

The n-type GaN-based layer, the p-type GaN-based layer, and the active layer in the LED devices of FIGS. 1A-1B and 2A-2B are formed using a GaN-based material. When a voltage is applied to the LED devices, injected carriers (i.e., holes and electrons) recombine in the active layers, and generate light emission. The reflective index of the GaN-based material is around 2.4 at a wavelength of 460 nm. If an incident angle of light at the interface between the GaN-based layer and the ambient air (or other encapsulating material) is greater than a critical angle, a substantial portion of light generated inside the LED device is likely to get trapped inside the LED device due to total-internal-reflection (TIR). According to Snell's Law, the critical angle at the GaN/air interface is about 24.6 degrees. Conventionally, to increase the chance of light escaping from the LED device, the top surface of the LED device is randomly roughened to break up the limitation of the TIR.

Figure 3:
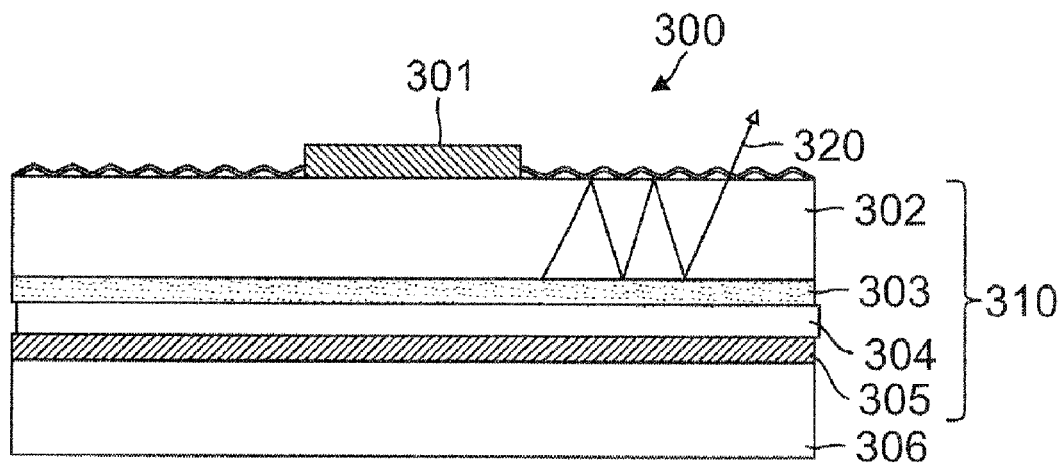
FIG. 3 illustrates an exemplary light extraction occurring in a vertical LED structure.

Light extraction for an LED device will be described with reference to FIG. 3. The LED device 300 in FIG. 3 is a vertical LED device that includes a GaN-based material structure 310, including an n-type GaN-based layer 302, an active region 303, a p-type GaN-based layer 304, an n-type electrode 301, and a p-type electrode 305 mounted on a substrate 306. Reference number 320 indicates the direction of travel of light generated inside the LED device 300. Usually, the light emitting from the active region 303 has about a 50/50 chance of propagating toward the top surface or the bottom surface of the LED device 300. The p-type electrode (also referred to interchangeably herein as the reflective electrode) 305 is used to re-direct the light propagating back to the top surface of the LED device 300, as shown in FIG. 3. The reflective electrode 305 usually contains a metal, and the reflectivity of the reflective electrode 305 is made to be as high as possible to reduce reflection loss, since the light emission tends to be reflected multiple times before escaping the LED devices, as shown in FIG. 3

Silver (Ag) is a suitable metal for forming a reflective electrode of an AlInGaN LED device because Ag has a high reflectivity in the wavelength range of interest (i.e., 400-700 nm), and this material can form ohmic contact with a p-type GaN-based layer. Due to an epitaxial growth process and growth conditions used in manufacturing the GaN-based material structure, there is generally some roughness on the p-type GaN-based layer.

Figure 4:
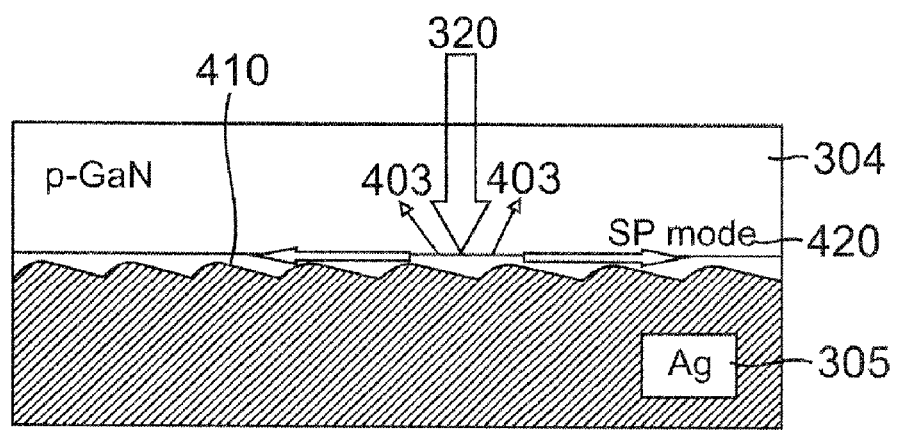
FIG. 4 is a schematic diagram of a rough interface between a p-GaN layer and a silver (Ag) layer, showing that the rough interface scatters an incident light as well as couples the light into the surface plasmon mode.

FIG. 4 is an enlarged view of the p-type electrode 305 comprising Ag and the p-type GaN-based layer 304 of FIG. 3, showing light extraction inside the LED device 300. Usually, the normal incidence of reflectance of Ag measured from the p-type GaN-based layer side is lower than an expected value from a simple optical model calculation because of scattering effects 403 and surface plasmon (SP) absorption 420 resulting from the rough GaN/Ag interface 410, as shown in FIG. 4. The rough interface 410 scatters the normal incident light in random directions and reduces the specular reflection at all wavelengths. No photons are typically lost in the scattering process because the photons will continue to be reflected inside the LED device and will eventually escape the LED device 300 to, for example, ambient air. However, the photons coupled in the surface plasmon (SP) mode 420 typically will not be able to escape and eventually will be lost. As result, the SP absorption can have a significant effect on the reflectance measurement. Under experimental measurements, the strength of the SP absorption generally correlates to the degree of interface roughness. Even though the SP absorption peak may be below 400 nm, the width of the absorption may still be wide enough to significantly reduce Ag reflectance for wavelengths of around 460 nm.

The p-type electrode (e.g., Ag electrode) may be deposited on the p-type GaN-based layer by a physical (e.g., electron-beam or thermal) evaporation process, and Ag will conform to the p-type GaN-based layer surface without voids if the deposition is performed properly. The roughness of the p-type GaN-based layer/Ag interface is determined by the quality of the p-type GaN-based layer. The presence of voids created during the deposition process or contact annealing process, however, may increase the interface roughness and further enhance the SP absorption.

To achieve a high reflectance value at the p-type GaN layer/Ag electrode interface, an LED device is provided in which the p-type GaN-based layer has a root-mean-square (RMS) roughness less than about 3 nm to ensure appropriate smoothness of the p-type GaN-based layer/Ag electrode interface and to thereby minimize the SP absorption.

In a variation, a method for manufacturing the p-type GaN-based layer with a smooth surface is provided, such that the SP absorption can be reduced to a maximum extent.

FIGS. 5A-5C and 6A-6C illustrate manufacturing processes for a vertical LED device 500 and a flip-chipped lateral LED device 600, respectively. The processes of FIGS. 5A and 6A basically follow similar manufacturing steps, except with regard to the formation of an n-type electrode and final mounting.

Figure 5A:
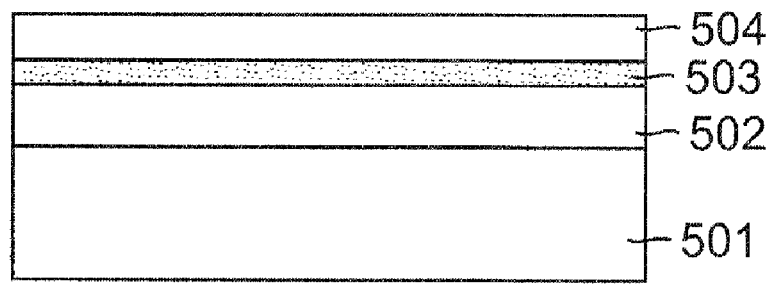
FIGS. 5A-5C illustrate a process for manufacturing a vertical LED that has a smooth surface for forming reflective electrode.
Figure 5B:
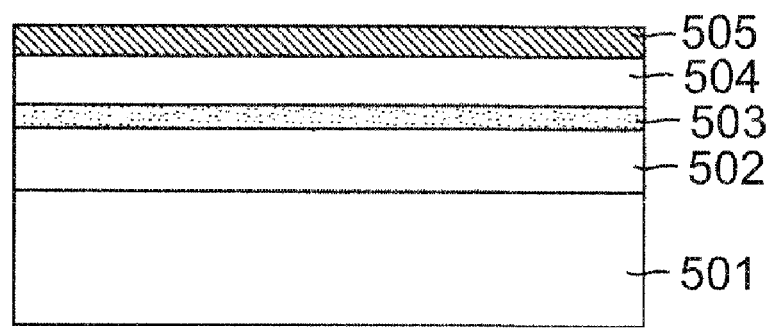

In FIG. 5A, an n-type GaN-based layer 502 is formed on a substrate, such as a sapphire substrate 501. Above the n-type GaN-based layer 502, an active layer 503 and a p-type GaN-based layer 504 are formed. In an example, the RMS roughness of the surface of the p-type GaN-based layer 504 that will interface with a p-type electrode 505, shown in FIG. 5B, is preferably controlled to be less than about 3 nm. In an example, the p-type GaN-based layer 504 is formed by MOCVD (Metal-Organic Chemical Vapor Deposition) using metal-organic compound such as trimethyl gallium (TMGa), trimethyl indium (TMIn), trimethyl aluminum (TMAl), and ammonia, hydrogen, nitrogen as well as dopant precursors for silicon and magnesium in a reactor chamber with controlled pressure and temperature. Furthermore, the growth temperature in the deposition process is preferably greater than about 950° C. and the growth rate is preferably less than about 150 Å/min.

After depositing the p-type GaN-based layer with RMS roughness less than about 3 nm, the p-type electrode 505 is formed on the p-type GaN-based layer 504, as shown in FIG. 5B. Alternatively, prior to depositing the p-type electrode 505, a transparent ohmic contact layer (not shown) may be formed on the p-type GaN-based layer 504. The transparent ohmic contact layer may be formed by, for example, electron-beam evaporation, sputtering, MOCVD, etc., with doped metal oxides, such as indium tin oxide (ITO) or aluminum doped zinc oxide (AZO). Similarly, when the transparent ohmic contact layer is presented, the RMS roughness of the transparent ohmic contact layer may be controlled to be less than about 3 nm regardless of the RMS roughness of the p-GaN surface.

As described above, the p-type electrode 505 of FIGS. 5B and 5C is a reflective layer for reflecting light emitted downwardly back to the top surface of the LED device, as shown in FIGS. 5B and 5C. Exemplary metals used in forming the p-type electrode 505 include Ag, Pt, Ni, Cr, Ti, Al, Pd, Ru, Rh, Mo, and their alloys.

Figure 5C:
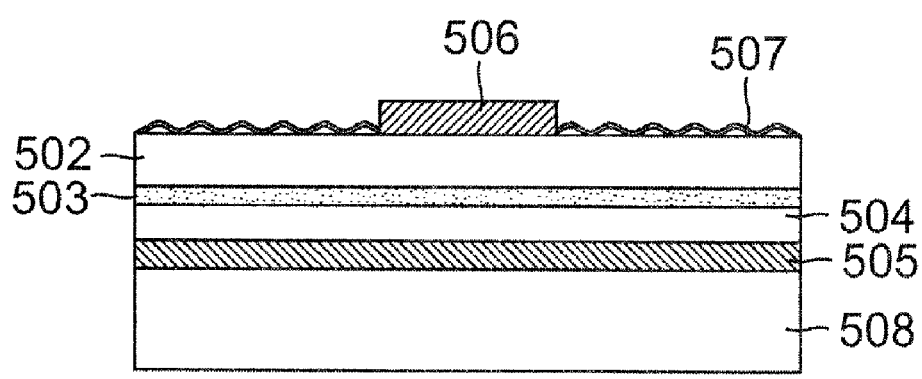

In a variation, after the p-type electrode 505 is formed, the substrate 501 is removed from the n-type GaN-based layer 502 to allow an n-type electrode 506 to be formed on the surface of the n-type GaN-based layer 502 that was attached to the substrate 501, as shown in FIG. 5C. The surface of the n-type GaN-based layer 502 on which the n-type electrode 506 is formed is roughened according to a conventional roughening method to minimize the total internal reflection (TIR) effect and enhance light extraction efficiency. Also, as shown in FIG. 5C, the p-type electrode 505 may be mounted on a sub-mount substrate 508 for a mechanical support. The sub-mount substrate 508 may include similar materials to those used in the substrate 501. That is, the sub-mount substrate 508 may be selected from one or more of the followings: metals, such as Cu, Mo, W, and Al, or their alloys; semiconductor materials, such as Si, GaAs, GaP, InP, and Ge; and/or ceramics, such as $Al_2O_3$ and AlN.

Figure 6A:
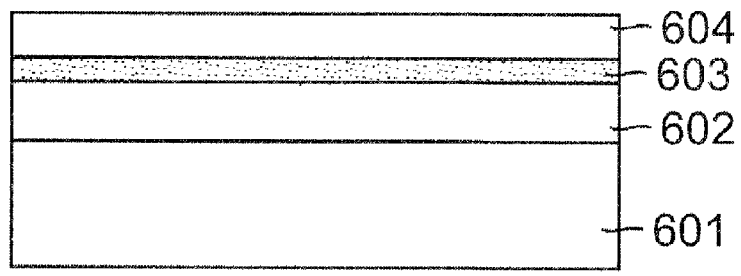
FIGS. 6A-6C illustrate a process for manufacturing a flip-chipped lateral LED structure that has a smooth surface for forming reflective electrode.
Figure 6B:
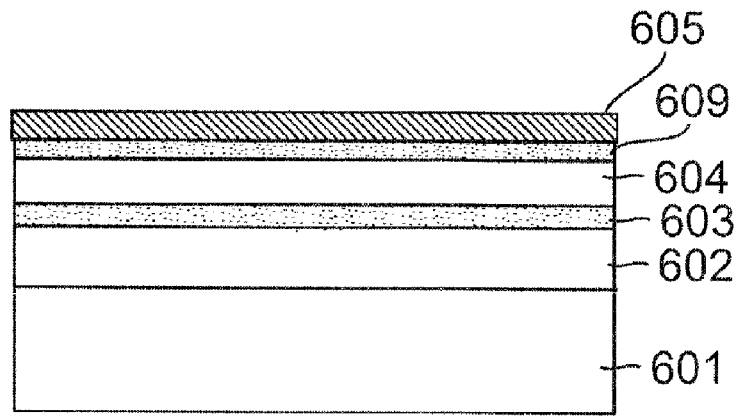
Figure 6C:
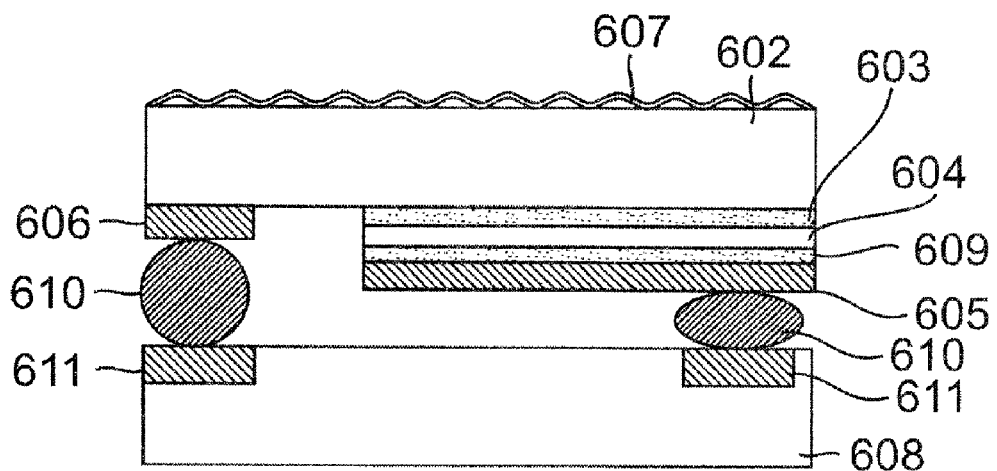

FIGS. 6A-6C will now be described in further detail. Similar to FIG. 5A, in FIG. 6A, an n-type GaN-based layer 602, an active layer 603, and a p-type GaN-based layer 604 are formed on a substrate, such as a sapphire substrate 601. As described above with reference to FIG. 5A, the p-type GaN-based layer 503 may be formed by a MOCVD (Metal-Organic Chemical Vapor Deposition) using metal-organic compound such as trimethyl gallium (TMGa), trimethyl indium (TMIn), trimethyl aluminum (TMAl), and ammonia, hydrogen, nitrogen as well as dopant precursors for silicon and magnesium in a reactor chamber with controlled pressure and temperature. The growth temperature in the deposition process is preferably greater than about 950° C. and the growth rate is preferably less than about 150 Å/min. Furthermore, the RMS roughness of the p-type GaN-based layer may be, for example, less than about 3 nm.

Next, in FIG. 6B, a transparent ohmic contact layer 609 and a reflective p-type electrode 605 are formed on the p-type GaN-based layer 604. As described above, the transparent ohmic contact layer 609 is optional and does not limit the scope of the invention. The RMS roughness of the surface in direct contact with reflective electrode 605, for example, the p-GaN surface or the transparent ohmic contact layer surface, may be less than 3 nm.

As a flip-chipped lateral LED device 600, FIG. 6C shows that parts of the reflective p-type electrode 605, the transparent ohmic contact layer 609, and the p-type GaN-based layer 604 are etched away to allow an n-type electrode 606 to be formed on top of the n-type GaN-based layer 602, as shown in FIG. 6C. The LED structure made by this process is then flipped over and mounted on a sub-mount substrate 608 with matching metal contact pads 611 via solder joints or metal interconnects 610. The metal contact pads 611 are electrically isolated from each other either by an electrically insulating sub-mount 608 or an insulating dielectric coating formed over an electrically conducting sub-mount (not shown).

Example embodiments in accordance with aspects of the present invention have now been described in accordance with the above advantages. It will be appreciated that these examples are merely illustrative of aspects of the present invention. Many variations and modifications will be apparent to those skilled in the art.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light emitting diode, comprising:
    an epitaxial layer structure;
    a first electrode; and
    a second electrode,
    wherein the first and second electrodes are disposed on one side of the epitaxial layer structure, and the epitaxial layer structure comprises a transparent ohmic contact layer having a root-means-square (RMS) roughness less than about 3 nm at a surface whereon the second electrode is formed,
    wherein the epitaxial layer structure includes a p-type epitaxial layer and a n-type epitaxial layer, wherein the n-type epitaxial layer is coupled between the first electrode and the p-type epitaxial layer, and the p-type epitaxial layer is between the second electrode and the n-type epiaxial layer, and wherein the first electrode is located on the n-type epitaxial layer.

2. The light emitting diode of claim 1, wherein the light emitting diode comprises a flip-chip structure.

3. The light emitting diode of claim 1, wherein the first electrode is an n-type electrode and the second electrode is a p-type electrode.

4. The light emitting diode of claim 1, wherein each of the p-type and n-type epitaxial layers comprises GaN.

5. The light emitting diode of claim 1, wherein each of the first and second electrodes includes a metal selected from a group of consisting of Ag, Pt, Ni, Cr, Ti, Al, Pd, W, Ru, Rh, Mo, and their alloys.

6. The light emitting diode of claim 1, wherein the p-type epitaxial layer is deposited via a MOCVD (Metal-Organic Chemical Vapor Deposition) using a metal-organic compound solution.

7. The light emitting diode of claim 1, wherein the p-type epitaxial layer is formed at a temperature no less than 950° C. at a growth rate no more than 150 Å/mim.

8. The light emitting diode of claim 1, further comprising a substrate, wherein the first and second electrodes are coupled to the substrate.

9. The light emitting diode of claim 8, wherein the substrate comprises first and second metal contact pads, the first electrode being coupled to the first metal contact pad and the second electrode being mounted to the second metal contact pad.

10. The light emitting diode of claim 9, wherein each of the first and second electrodes are respectively coupled to the first and second metal contact pads via solder welds or metal interconnects.

11. The light emitting diode of claim 9, wherein the substrate is electrically insulating between the first and second metal contact pads.

12. The light emitting diode of claim 9, wherein the substrate comprises a coating arranged to electrically isolate the first and second metal contact pads.

13. The light emitting diode of claim 8, wherein the substrate is selected from a group consisting of a metal, a semiconductor material, and a ceramic.

14. The light emitting diode of claim 13, wherein the metal includes at least one selected from a group consisting of Cu, Mo, W, and Al, wherein the semiconductor material includes at least one selected from a group consisting of Si, GaAs, GaP, InP, and Ge, and wherein the ceramic includes at least one selected from a group consisting of $Al_2O_3$ and AlN.

* * * * *